(12) United States Patent
Wickmann et al.

(10) Patent No.: US 11,683,056 B2
(45) Date of Patent: Jun. 20, 2023

(54) INSTANT RF OVERVOLTAGE PROTECTION ELEMENT

(71) Applicant: Infineon Technologies AG, Neubiberg (DE)

(72) Inventors: Andreas Wickmann, Nuremberg (DE); Thomas Leitner, Pregarten (AT)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 17/319,592

(22) Filed: May 13, 2021

(65) Prior Publication Data

US 2022/0368361 A1 Nov. 17, 2022

(51) Int. Cl.
*H04B 1/10* (2006.01)
*H04B 17/21* (2015.01)
*G01R 21/01* (2006.01)

(52) U.S. Cl.
CPC ............... *H04B 1/10* (2013.01); *G01R 21/01* (2013.01); *H04B 17/21* (2015.01)

(58) Field of Classification Search
CPC ........... H04B 1/10; H04B 17/21; G01R 21/01
See application file for complete search history.

(56) References Cited

U.S. PATENT DOCUMENTS

| | | | |
|---|---|---|---|
| 4,163,909 A | 8/1979 | Harr | |
| 2005/0140396 A1 | 6/2005 | Glass | |
| 2012/0034895 A1 | 2/2012 | Xuechu et al. | |
| 2020/0111470 A1* | 4/2020 | Kaczynski | G10H 3/125 |
| 2020/0328916 A1* | 10/2020 | Nikitin | H04B 1/1027 |
| 2021/0119593 A1* | 4/2021 | Rabjohn | H04B 1/40 |
| 2021/0376730 A1* | 12/2021 | Yan | H02M 3/1584 |
| 2022/0173659 A1* | 6/2022 | Choi | H02M 3/158 |
| 2022/0345040 A1* | 10/2022 | Couleur | H02M 1/08 |

* cited by examiner

*Primary Examiner* — Thanh C Le
(74) *Attorney, Agent, or Firm* — Slater Matsil, LLP (57) ABSTRACT

A peak detector includes an asymmetrical latch having a first input and a second input; and a CMOS converter having a first input coupled to a first output of the asymmetrical latch, a second input coupled to a second output of the asymmetrical latch, and an output.

20 Claims, 10 Drawing Sheets

INSTANT RF OVERVOLTAGE PROTECTION ELEMENT

TECHNICAL FIELD

The present invention relates generally to an instant radio frequency (RF) overvoltage protection element system and method.

BACKGROUND

High voltage RF switching circuitry is used in many system applications, for example communication system applications, and can be implemented in a high voltage RF module. The high voltage RF module is typically connected to a high voltage load, but is also connected to low voltage circuitry in the system. It is important that the low voltage circuitry is protected from damage by any spurious high voltage signals escaping from the high voltage RF module. High voltage RF voltages at the output of the high voltage RF module can permanently damage low voltage integrated circuits and thus impact the performance of the whole system.

SUMMARY

According to an embodiment, a peak detector includes an asymmetrical latch having a first input and a second input; and a CMOS converter having a first input coupled to a first output of the asymmetrical latch, a second input coupled to a second output of the asymmetrical latch, and an output.

According to an embodiment, a method includes amplifying a differential input signal to provide an amplified differential signal; asymmetrically latching the amplified differential signal to provide a latched differential signal; and converting the latched differential signal into a CMOS-level output signal.

According to an embodiment, a system includes a first amplifier in communication with an attenuator; and a voltage detector coupled to an output of the first amplifier, and coupled to a control input of the attenuator, wherein the voltage detector comprises a second amplifier, an asymmetrical latch, and a CMOS converter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments are described below comprising an implementation of a fast RF peak-voltage detector in combination with a "digital-mode" RF attenuator to form a virtually instant protection element to protect sensitive components in modern RF transceiver applications. Protection element embodiments comprise a precise and fast RF peak-voltage detector including a modified current-mode-logic (CML) latch, which can be adjusted to change an overvoltage threshold.

Figure 1:
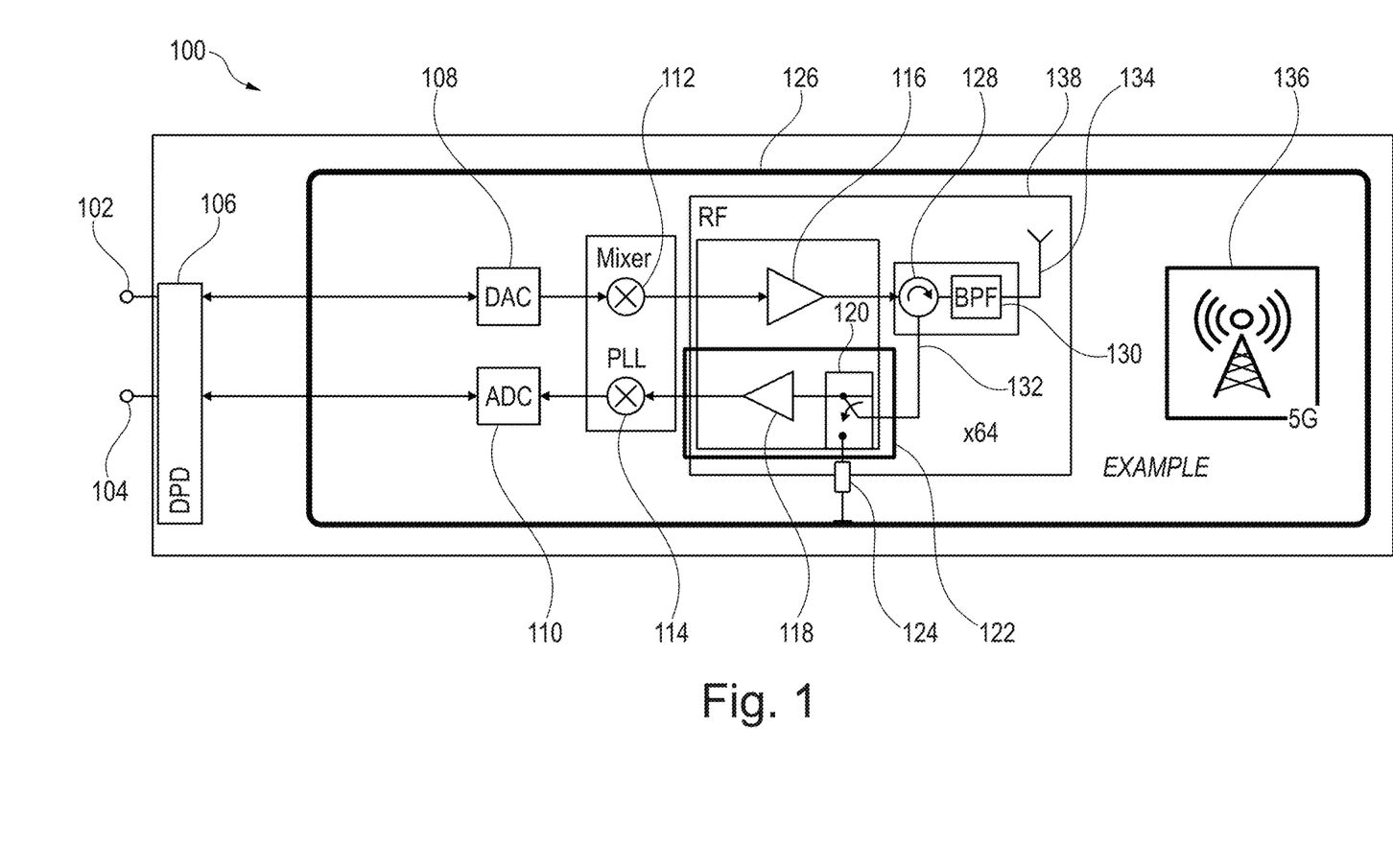
FIG. 1 is a block diagram of a 5G sub-6 GHz remote radio head with 64 TX and 64 RX channels.

FIG. 1 is a block diagram of an exemplary 5G sub-6 GHz remote multiple-input multiple-output (MIMO) radio head 100 with 64 transmit (TX) and 64 receive (RX) channels, including a TX input 102, an RX output 104, a digital pre-distortion block 106, a mixer 112, a phase-locked loop 114, a low-noise amplifier (LNA) 116, an LNA 118, a high power RF switch 120, a load resistor 124, an RF circulator 128 coupled to RF switch through path 132, band-pass filter (BPF) 130, an antenna 134 that is communication with 5G network cell tower 136. LNA 116, LNA 118, RF switch 120, RF circulator 128, BPF 130, and antenna 134 can be formed in a high voltage RF module 138.

The TX path of radio head 100 includes DAC 108, mixer 112, LNA 116, BPF 130, and antenna 134 to transmit signals. The RX path of radio head includes high power RF switch 120, LNA 118, PLL 114 and ADC no to receive and process the received signals. In an example, LNA 118 has a multistage topology and is supplied from a 5V power supply to fulfill strict gain and linearity requirements. Depending on the gain settings and received input signal power, LNA 118 can generate output signals well above 5 dBm. The interacting integrated circuits (IC) including PLL 114 are also implemented in a low voltage technology, which cannot handle such power levels. Therefore, the output voltage of LNA 118 is ideally limited to a certain value to avoid permanent damage in the low voltage ICs. Ideally, the overvoltage protection level is adjustable by customer and has a virtually "instant" reaction time in the range of 1 ns.

Embodiments of the present invention advantageously provide such a protection element solution and are generally directed to and located within portion 122 of the receive path of radio head 100.

Figure 2:
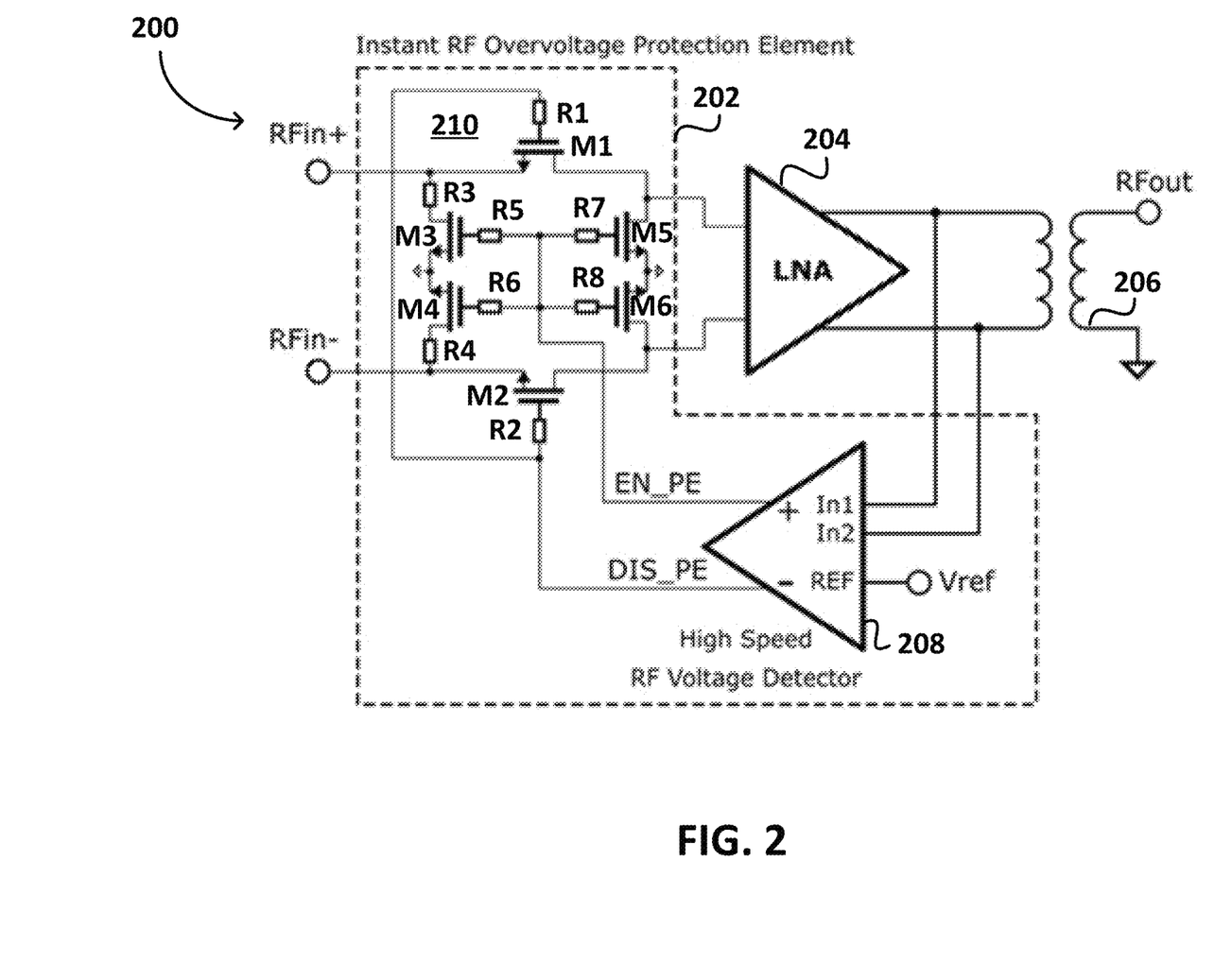
FIG. 2 is a block diagram of a protection element according to an embodiment.

FIG. 2 is a block diagram of a protection element 202, and also including an LNA 204 coupled to transformer 206 in a receive path of a radio head portion 200, according to an embodiment. The protection element 202 includes RF inputs RFin+ and RFin−, and transformer 206 provides an RF output RFout, in an embodiment.

Protection element 202 includes an attenuator 210 coupled to RF inputs RFin+ and RFin−, and a high speed RF voltage detector 208 coupled between outputs of LNA 204 and inputs of attenuator 210. Attenuator 210 includes MOS transistors M3 and M4, and MOS transistors M5 and M6 coupled between RF inputs RFin+ and RFin−, and MOS transistors M1 and M2 coupled between MOS transistors M3 and M4, and MOS transistors M5 and M6. MOS transistor M1 is coupled to gate resistor R1, MOS transistor M2 is coupled to gate resistor R2, MOS transistor M3 is coupled to drain resistor R3 and gate resistor R5, MOS transistor M4 is coupled to drain resistor R4 and gate resistor R6, MOS transistor M5 is coupled to gate resistor R7, and MOS transistor M6 is coupled to gate resistor R8, in an embodiment. While attenuator 210 is shown with NMOS transistors, PMOS transistors or other types of transistors can be used.

Protection element 202 also includes a high speed RF voltage detector 208 having a first input (In1) coupled to a first output of LNA 204 and a second input (In2) coupled to a second output of LNA 204, in an embodiment. In an embodiment, high speed RF voltage detector 208 also has a third input (REF) for receiving a reference voltage (Vref) from a reference voltage source. In an embodiment, high speed RF voltage detector 208 has a positive output designated EN_PE (enable) coupled to gate resistors R5, R6, R7, and R8, and a negative output designated DIS_PE (disable) coupled to gate resistors R1 and R2. Further details of high speed RF voltage detector 208 are described below particularly with respect to the embodiments of FIG. 3A, FIG. 3B, FIG. 3C, and FIG. 4.

In operation, high-speed peak RF voltage detector 208 monitors the outputs of LNA 204. The threshold of the high-speed peak RF voltage detector 208 can be programed via a digital interface that is described in further detail below according to various embodiments. Once an overvoltage is detected, RF attenuator 210 is enabled with a CMOS voltage level to limit the RF voltage at the output thereof. Attenuator 210 with a digital mode control has an advantage of minimum delay, according to embodiments. Depending linearity system requirements, attenuator 210 can be placed in front or after LNA 204. FIG. 2 thus shows only one possible embodiment, wherein attenuator 210 is placed in front of LNA 204.

The speed and accuracy of the high-speed peak RF voltage detector 208 defines the overall performance of protection element 202. An RF peak voltage of only a few mV in excess of a predetermined overvoltage threshold has to be reliably detected and latched in order to adequately protect other low voltage integrated circuit in electrical communication with module 138 shown in FIG. 1. The overall delay from crossing the overvoltage threshold to CMOS output (EN_PE and DIS_PE) is ideally less than two ns. In some embodiments the overall delay is less than 0.5 ns.

Figure 3A:
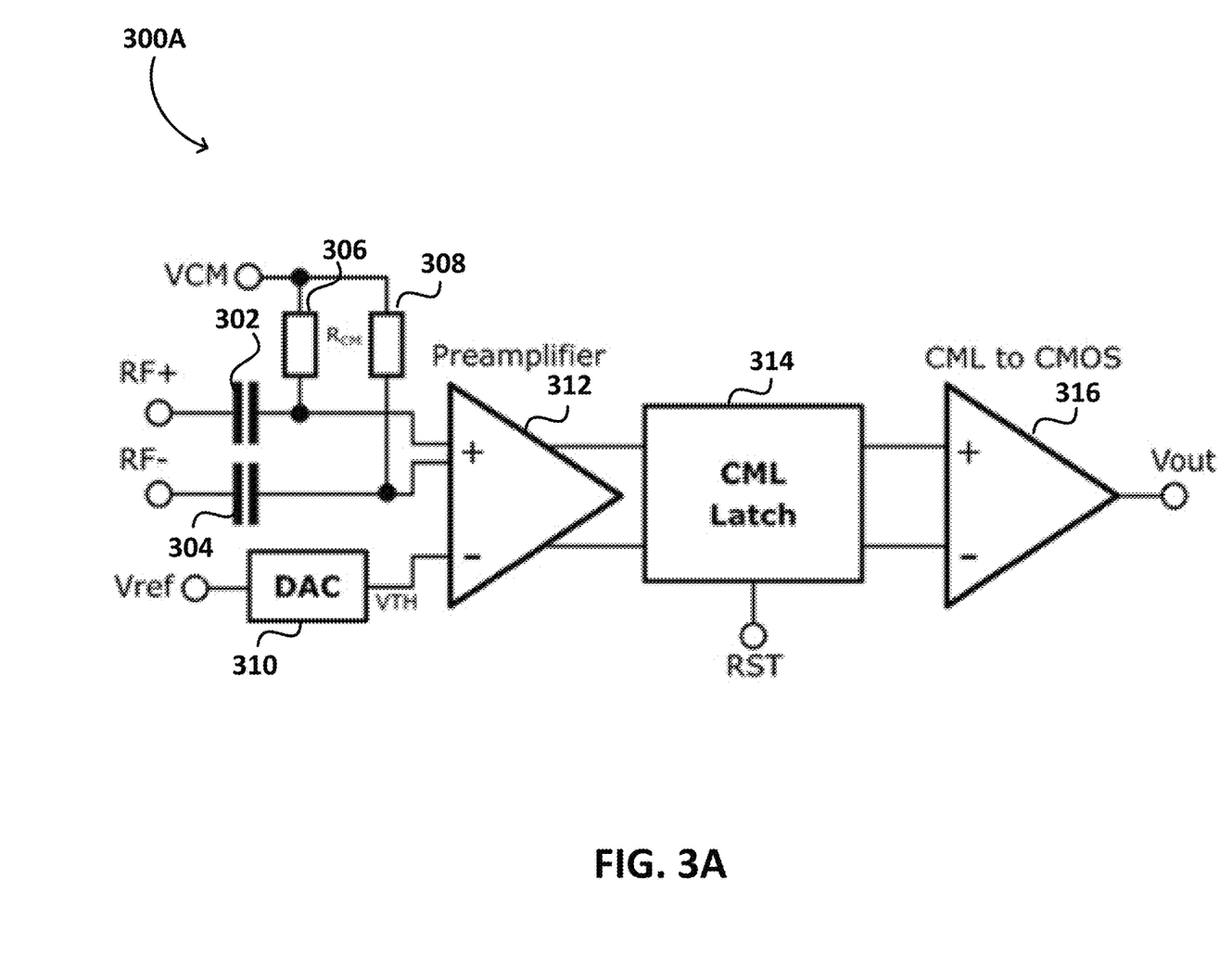
FIG. 3A is a block diagram of an RF peak voltage detector of the protection element according to an embodiment.

FIG. 3A is a block diagram of an RF peak voltage detector 300A of the protection element 202 according to an embodiment. RF signals RF+ and RF− are AC coupled through capacitors 302 and 304 to overcome different DC operating points of the output of LNA 204 and the detector input. A first resistor 306 ($R_{CM}$) is coupled between a source of common mode voltage VCM and capacitor 302. A second resistor 308 ($R_{CM}$) is coupled between the source of common mode voltage VCM and capacitor 304. Preamplifier 312 at the input of RF peak voltage detector 300A compares RF signals RF+ and RF− at first and second positive inputs with a threshold voltage VTH at a negative input. In an embodiment, a voltage Digital-to-Analog Converter (DAC) 310 is used to adjust the threshold voltage, which defines the protection element trigger level. DAC 310 is coupled between a source of reference voltage (Vref) and the threshold voltage VTH input of preamplifier 312. The differential output of preamplifier is applied to an asymmetrical current-mode-logic (CML) latch 314 that is described in further detail below. The term "asymmetrical" is defined as the property of CML latch 314 to latch only in response to a single edge input signal crossing a latch threshold. In an embodiment, CML latch 314 latches only in response to a rising edge input signal, in order to provide a fast and reliable response to an input signal exceeding the overvoltage threshold. In an embodiment, CML latch 314 includes a reset (RST) input. The differential output of CML latch 314 is received by the differential input of CML to CMOS converter 316. CML to CMOS converter 316 has a low voltage output at CMOS levels and can be a differential output as is shown in FIG. 2, or a single-ended output (Vout) as is shown in FIG. 3A. In embodiments, preamplifier 312 can be eliminated altogether, and all of the amplification of RF peak voltage detector 300A can be provided by asymmetrical CML latch 314, which is described in further detail below.

In an embodiment, DAC 310 provides very flexible and convenient possibility to adjust the overvoltage threshold of RF peak voltage detector 300A. Moreover, DAC 310 and/or reference voltage Vref can be used to achieve compensation of the detector threshold drift over temperature, supply voltage or even frequency. In the example of FIG. 3A, the overvoltage threshold of RF peak voltage detector 300A can be adjusted in conjunction with adjusting the value of common-mode voltage VCM in addition to adjusting the value of the reference voltage Vref and/or the gain of DAC 310.

The high-speed preamplifier 312 reduces the impact of the threshold variation of the CML latch 314. Moreover, the preamplifier 312 provides a constant RF input impedance in both the sensing and reset state, which can be advantageous during calibration of the receive channel.

Once an input signal crosses the threshold voltage, the CML latch 314 is triggered and stores permanently the overvoltage event. Preamplifier 312 and CML latch 314 are the fastest components in the protection element and enables the attenuator with a virtually instant detection time. After the overvoltage event is detected, the CML voltage level at the output of the CML latch 314 is further amplified to the CMOS level by CML to CMOS converter 316 to control the attenuator.

To detect positive and negative overvoltage, both phases of the differential input signal are monitored. This approach has the advantage of a very simple and power-efficient implementation because only one extra transistor in the preamplifier input stage is required, as will be explained in further detail below with respect to the transistor-level schematic of FIG. 4.

Figure 3B:
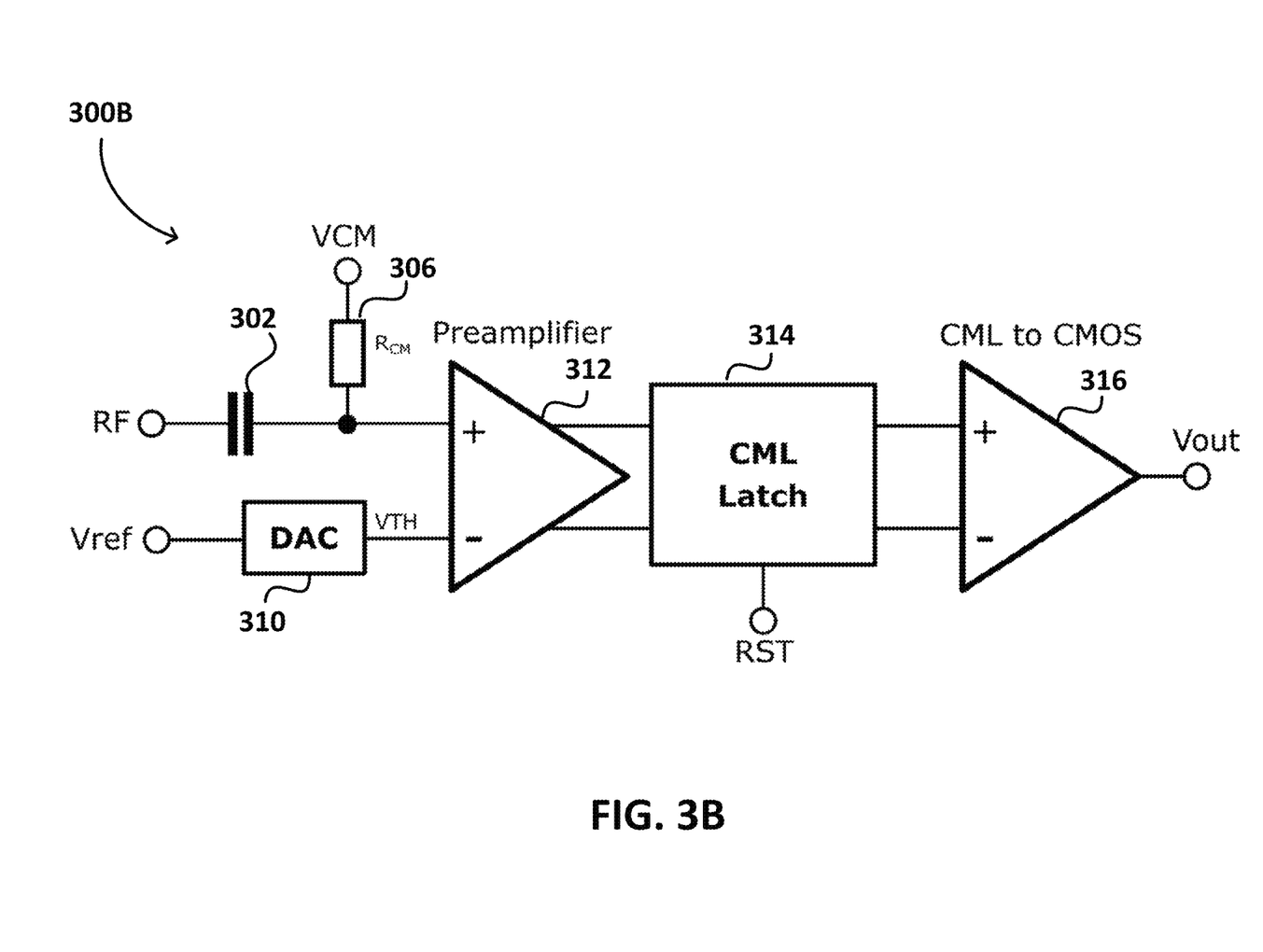
FIG. 3B is a block diagram of an RF peak voltage detector of the protection element according to another embodiment.

FIG. 3B is a block diagram of an RF peak voltage detector 300B of the protection element 202 according to another embodiment. The asymmetrical CM latch 314 and the CML to CMOS converter 316 are essentially the same as those shown in the block diagram of RF peak voltage detector 300A of FIG. 3A. However, in FIG. 3B, preamplifier 312 includes only a single positive input and a single negative input. A single capacitor 302 is coupled between a single RF input and the positive input of preamplifier 312. A single common mode resistor 306 ($R_{CM}$) is coupled between common mode voltage source VCM and the positive input of preamplifier 312. In the embodiment of FIG. 3B DAC 310 is coupled between a Vref voltage source and the negative input of preamplifier 312 (VTH).

Figure 3C:
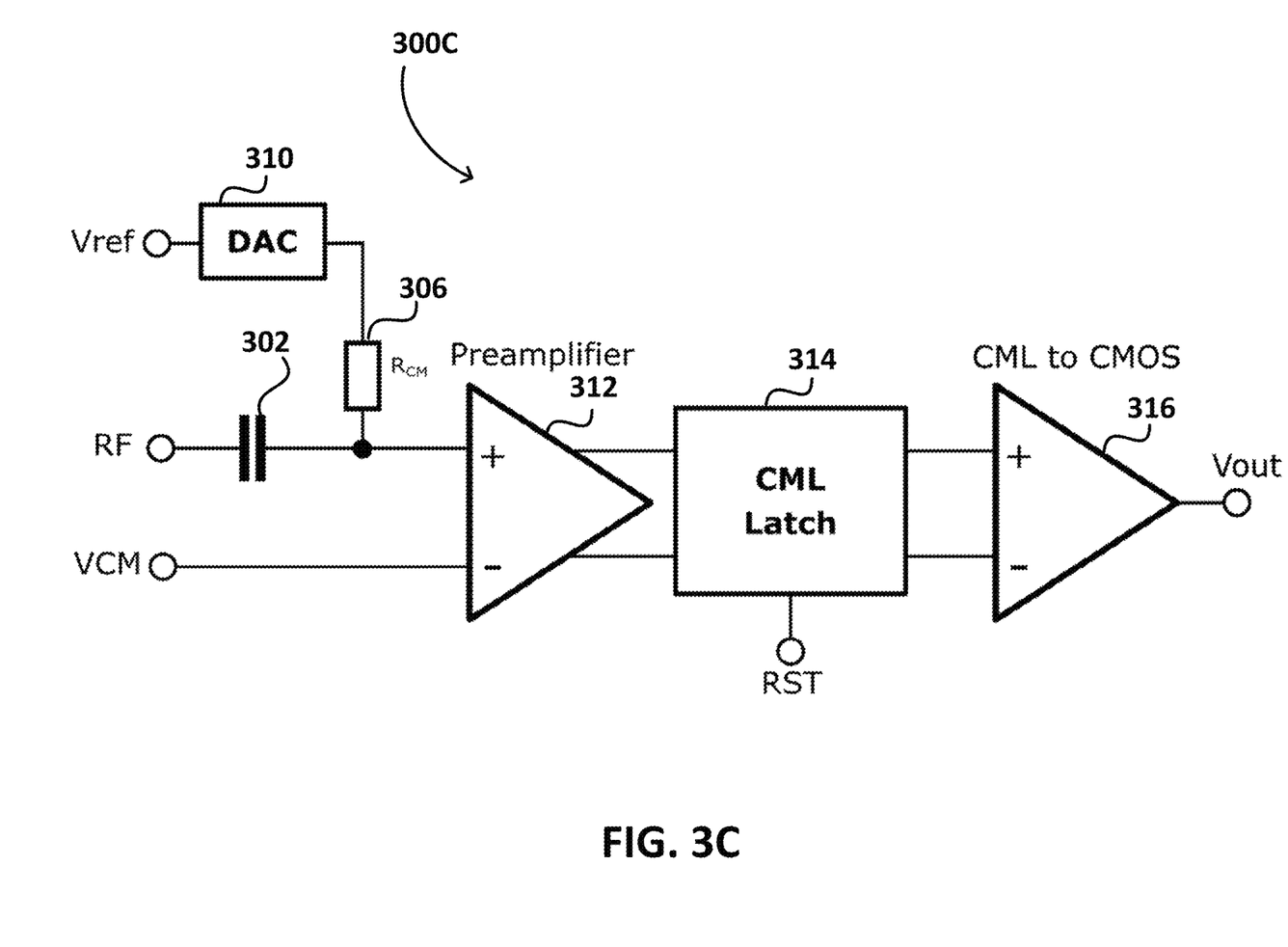
FIG. 3C is a block diagram of an RF peak voltage detector of the protection element according to another embodiment.

FIG. 3C is a block diagram of an RF peak voltage detector 300C of the protection element 202 according to another embodiment. The asymmetrical CML latch 314 and the CML to CMOS converter 316 are essentially the same as those shown in the block diagram of RF peak voltage detector 300A of FIG. 3A. However, in FIG. 3C, preamplifier 312 includes only a single positive input and a single negative input. A single capacitor 302 is coupled between a single RF input and the positive input of preamplifier 312. A single common mode resistor 306 (RCM) is coupled between an output of DAC 310 and the positive input of preamplifier 312. In the embodiment of FIG. 3C DAC 310 is coupled between a Vref voltage source and common mode resistor 306, and common mode voltage source VCM is coupled to the negative input of preamplifier 312.

Figure 3D:
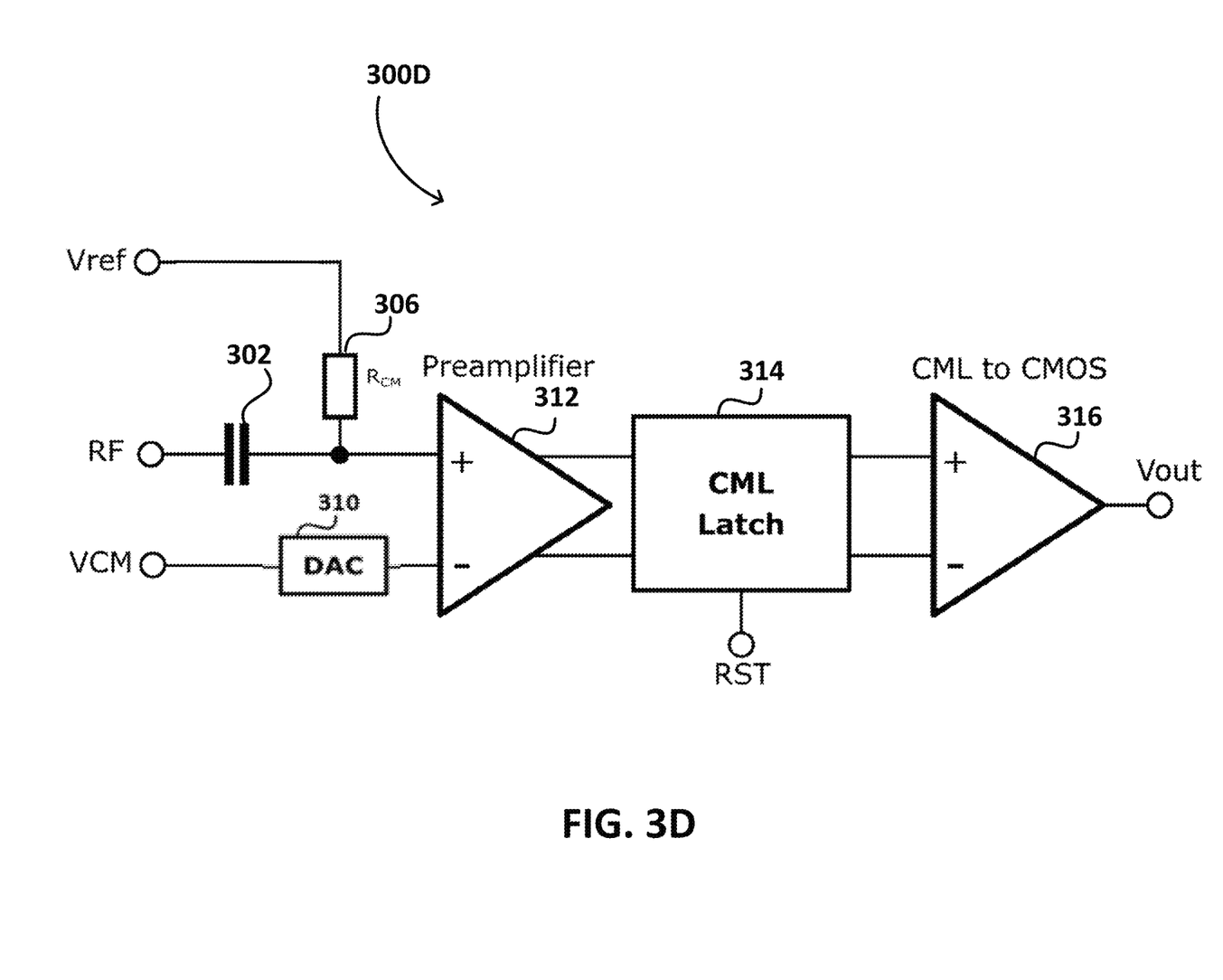
FIG. 3D is a block diagram of an RF peak voltage detector of the protection element according to another embodiment.

FIG. 3D is a block diagram of an RF peak voltage detector 300D of the protection element 202 according to another embodiment. The asymmetrical CML latch 314, the CML to CMOS converter 316, and the preamplifier 312 are essentially in the same configuration shown in the block diagram of RF peak voltage detector 300C of FIG. 3C. However, in the embodiment of FIG. 3D DAC 310 is coupled between the VCM voltage source and the negative input of preamplifier 312, and resistor 306 is coupled to the Vref voltage source. The embodiment concepts of FIG. 3C and FIG. 3D (or FIG. 3B and FIG. 3D, or FIG. 3A and FIG. 3D) can be combined so that two DACs are used, one to adjust the VCM common mode voltage, and one to adjust the Vref reference voltage, if desired.

Figure 4:
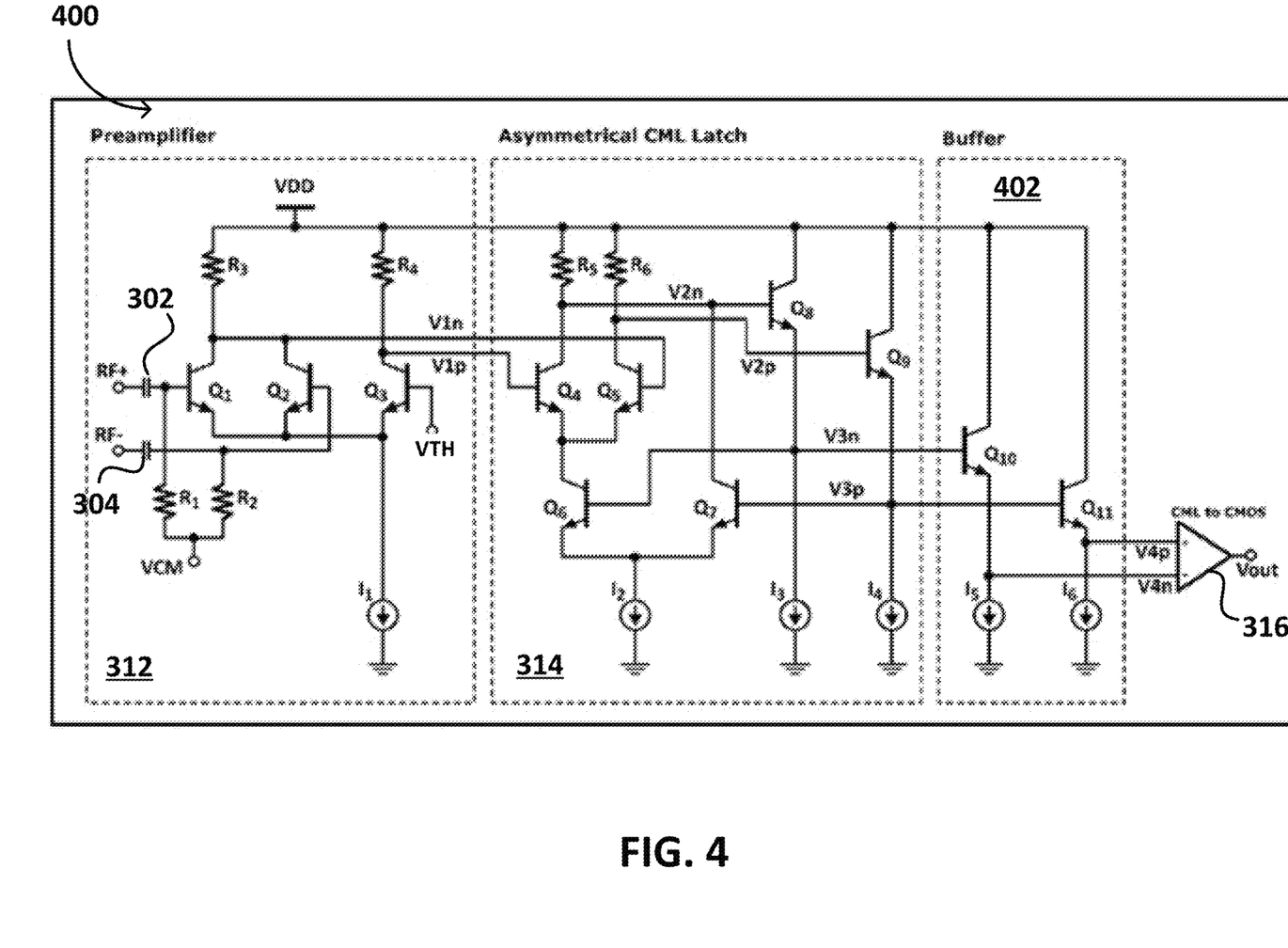
FIG. 4 is a transistor-level schematic an RF peak voltage detector of the protection element according to an embodiment.

FIG. 4 is a transistor-level schematic an example RF peak voltage detector 400 of the protection element 202 according to an embodiment. RF peak-voltage detector 400 comprises a preamplifier 312, an asymmetrical latch 314, a buffer amplifier 402, and a CML to CMOS converter 316, which are all described in further detail below. While bipolar transistors are shown in FIG. 4, it will be appreciated by those skilled in the art that MOS or other types of transistors may be used. While an example transistor-level schematic of an example RF peak voltage detector 400 is shown in FIG. 4, other implementations are possible for any or all of preamplifier 312, asymmetrical CML latch 314, buffer 402, and/or CML to CMOS converter 316. Any of these subcomponents can be combined or eliminated, in embodiments.

Preamplifier 312 includes transistors $Q_1$, $Q_2$, and $Q_3$, resistors $R_1$, $R_2$, $R_3$, and $R_4$, capacitors 302 and 304, and constant current source $I_1$. The inputs of preamplifier 312 are RF+ and RF− and the outputs of preamplifier are V1$n$ and V1$p$. Asymmetrical CML latch 314 includes transistors $Q_4$, $Q_5$, $Q_6$, $Q_7$, $Q_8$, and $Q_9$, resistors $R_5$ and $R_6$, and constant current sources $I_2$, $I_3$, and $I_4$. The inputs of asymmetrical CML latch 314 are V1$n$ and V1$p$, and the outputs of asymmetrical CML latch 314 are V3$n$ and V3$p$. Asymmetrical CML latch 314 includes internal nodes V2$n$ and V2$p$ at the collectors of transistors Q4 and Q5. Buffer amplifier 402 includes transistors $Q_{10}$ and $Q_{11}$, and constant current sources $I_5$ and $I_6$. The inputs of buffer amplifier 402 are V3$n$ and V3$p$, and the outputs of buffer amplifier 402 are V4$p$ and V4$n$. The inputs of CML to CMOS converter 316 are V4$n$ and V4$p$, and the output of CML to CMOS converter is a single-ended output Vout. A differential output, however, may also be used. Any appropriate design can be used for CML to CMOS converter 316 as long a single-ended or differential CMOS level output with minimum delay.

Transistors $Q_1$, $Q_2$, and $Q_3$, resistors $R_1$, $R_2$, $R_3$, and $R_4$ and biasing current source I1 form the high-speed preamplifier 312 with AC coupled inputs through capacitors 302 and 304. Preamplifier 312 amplifies the voltage difference between sum of the VCM voltage and RF signal amplitude (RF+ and RF−) and a reference voltage received at the base of transistor $Q_3$ (VTH). The threshold of the detector can be changed either through adjustment of the voltage VCM or through the voltage received at the VTH node. The VTH voltage can be adjusted directly, or with a DAC receiving a reference voltage as previously described. Any appropriate DAC topology can be used. Changing the VCM voltage allows the DC operating point of the input stage $Q_1$, $Q_2$, and $Q_3$ during threshold crossing to be independent of the threshold voltage level. Monitoring of both signal phases is implemented with parallel connected input transistors $Q_1$ and $Q_2$. This solution advantageously requires no extra current and only little extra integrated circuit area. Any systematic temperature dependent errors resulting from e.g. base current can be compensated with a corresponding temperature coefficient in the reference voltage VREF received at the VTH node or in the VCM voltage.

The outputs of the preamplifier 312 are connected to the asymmetrical CML latch 314 at nodes V1$n$ and V1$p$. The asymmetrical CML latch 314 is in sensing mode as long as the preamplifier differential output voltage is negative. Only a positive output voltage difference triggers the latch through the positive feedback of transistors $Q_6$, $Q_7$, $Q_8$, and $Q_9$ and constant current sources $I_3$ and $I_4$. The latching event is extremely fast due to the positive feedback and the CML topology shown in FIG. 4. It should be noted that the asymmetrical function of asymmetrical latch is provided by the use of a single pull-down transistor Q7 having a collector coupled to the V2$n$ node.

After the overvoltage event is stored in asymmetrical latch 314 the CML to CMOS converter 316 amplifies the CML voltage to a full CMOS level. An additional voltage buffer amplifier 402 decouples CML to CMOS converter 316 from the main asymmetrical CML latch 314 in order to improve the speed of the latch. Any amplifier or comparator topology can be used for the CML to CMOS converter 316. Asymmetrical topologies can reduce the delay of the converter. This is possible because only the rising signal delay is of interest in an embodiment.

The asymmetrical CM latch 314 requires a reset signal for proper initialization after power up and switching back to sensing mode after overvoltage detection, which is shown in FIGS. 3A, 3B, and 3C. Various transistor-level implementations of the reset function are possible, which are not shown in FIG. 4. Any appropriate transistor-level implementation of the reset function may be used.

Constant current sources $I_1$, $I_2$, $I_3$, $I_4$, $I_5$, and $I_6$ shown in FIG. 4 can be implemented as NPN transistors as part of a multi-output current mirror. Other constant current source implementations such as resistor implementations can also be used.

Figure 5:
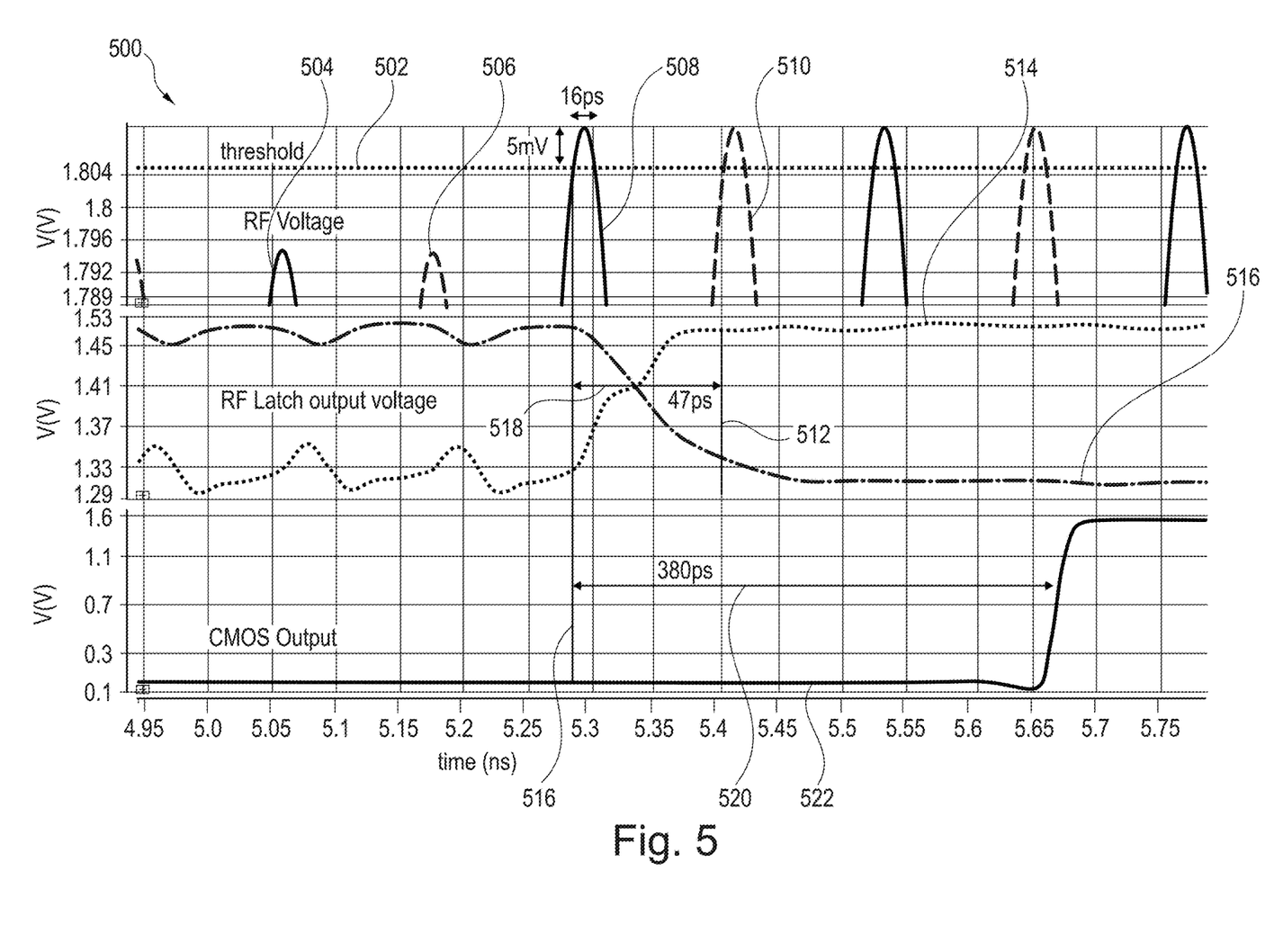
FIG. 5 is a graph of simulation results of the RF peak voltage detector input, internal, and output signals highlighting strict timing requirements.

FIG. 5 is a graph 500 of simulation results of the RF peak voltage detector input, internal, and external signals highlighting strict timing requirements. In the top portion of graph 500 an overvoltage threshold 502, a first RF input voltage 504 before the overvoltage event, a second RF input voltage 506 before the overvoltage event, a first RF input voltage 508 after the overvoltage event, and a second RF input voltage 510 after the overvoltage event. The overvoltage event occurs at a time slightly before time 516, which is the time at which the rising edge of RF input voltage 508 cross the overvoltage threshold 502. In the middle portion of graph 500 the RF latch output voltages 514 and 516 are shown. The RF latch output voltages fully latch at time 512, which about 47 picoseconds after time 516. In the bottom portion of graph 500 the CMOS output voltage 522 is shown. CMOS output voltage 522 is at a logic zero state and switches to a logic one state to enable the attenuator approximately 380 picoseconds after time 516, which is less than the design objective of about 500 picoseconds in an embodiment.

Figure 6:
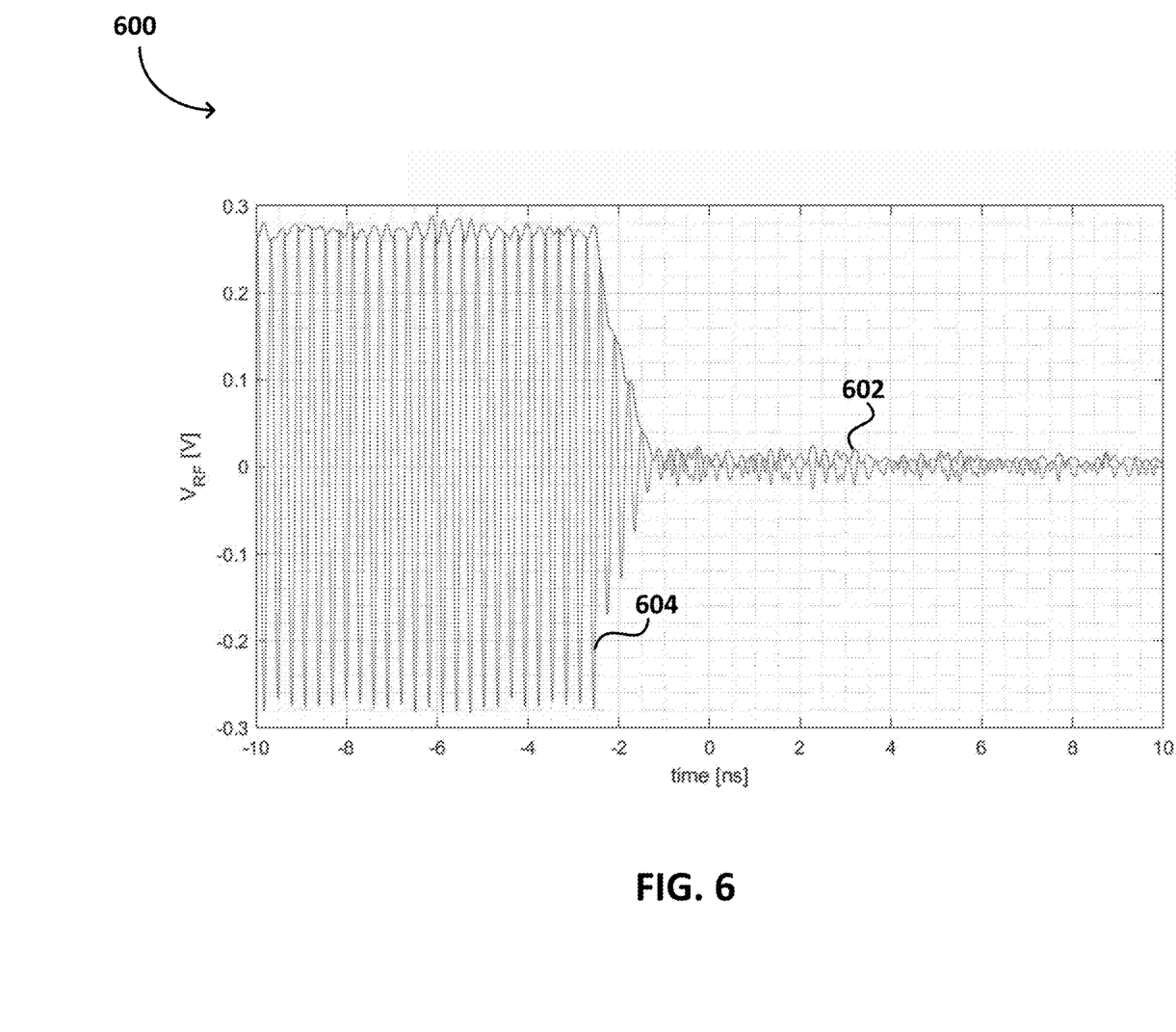
FIG. 6 is a graph of measurement results showing the RF voltage at the output of the attenuator versus time before and after the protection element has been triggered.

FIG. 6 is a graph 600 of measurement results showing the RF voltage 604 at the output of the attenuator versus time before and after the protection element has been triggered Signal 602 is the envelope of RF voltage 604 provided by the equipment used to measure RF voltage 604. Graph 600 shows that the RF voltage 604 completely collapses to a safe low level less than 1.5 ns after the overvoltage event.

Figure 7:
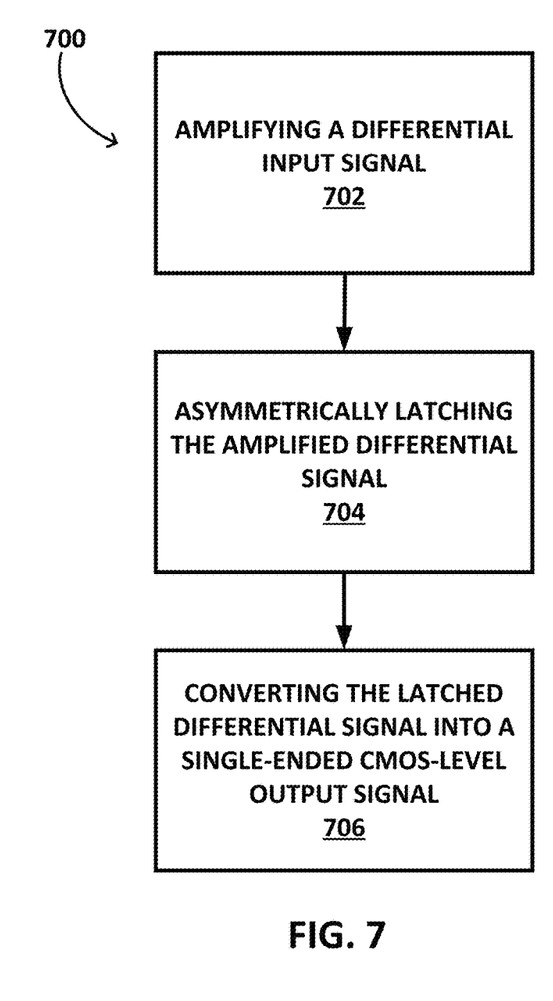
FIG. 7 is a block diagram of an overvoltage protection method, according to an embodiment.

FIG. 7 is a block diagram of an overvoltage protection method 700, according to an embodiment. Method 700 comprises amplifying a differential input signal to provide an amplified differential signal at step 702; asymmetrically latching the amplified differential signal to provide a latched differential signal at step 704; and converting the latched differential signal into a CMOS-level output signal 706.

Additional implementations are described below.

While RF peak voltage detector 400 has been described and shown using NPN transistors, the described detector topology can also be implemented also PNP or CMOS transistors.

The RF peak voltage detector can monitor the output voltage or any other internal voltage of a multistage LNA topology. In addition, the RF attenuator can be placed at any point in the signal chain.

The preamplifier can be removed if a less precise threshold level is acceptable.

The voltage buffer between CML latch and CMP to CMOS converter can be removed if smaller latch bandwidth is acceptable.

Peak voltage detection of both phases of the different signal can be replaced with two separate detectors, which detects positive and negative signal amplitude separately. Another variation of this implementation comprises two separate DACs and two separate preamplifiers to monitor the positive and negative sine half waves. Both preamplifiers share the same CML latch and converter to save current and integrated circuit area.

The implemented CML latch has asymmetrical positive feedback since this is the most efficient implementation for the embodiment described. However, positive feedback of the latch can also have a different and more complex implementation than the described embodiments.

In summary, according to embodiments, an implementation of a very fast RF peak-voltage detector in combination with a "digital-mode" RF attenuator forms a virtually instant protection element to protect sensitive integrated circuit components in modern RF transceiver applications.

In summary, according to embodiments, a precise and fast RF peak-voltage detector comprises the combination of a modified current-mode-logic (CML) latch and an analog DAC to adjust the threshold and compensate for errors. The RF peak-voltage detector, in combination with other components described herein, particularly an attenuator, form the protection element.

Example embodiments of the present invention are summarized here. Other embodiments can also be understood from the entirety of the specification and the claims filed herein.

Example 1. According to an embodiment, a peak detector includes an asymmetrical latch having a first input and a second input; and a CMOS converter having a first input coupled to a first output of the asymmetrical latch, a second input coupled to a second output of the asymmetrical latch, and an output.

Example 2. The peak detector of Example 1, further including a preamplifier having a first output coupled to the first input of the asymmetrical latch and a second output coupled to the second input of the asymmetrical latch.

Example 3. The peak detector of any of the above examples, wherein the asymmetrical latch is configured to latch only in response to a rising edge input signal crossing a latch threshold.

Example 4. The peak detector of any of the above examples, wherein a delay of the peak detector is less than two nanoseconds.

Example 5. The peak detector of any of the above examples, further including a first capacitor coupled between a first RF input and a first input of the preamplifier.

Example 6. The peak detector of any of the above examples, further including a second capacitor coupled between a second RF input and a second input of the preamplifier.

Example 7. The peak detector of any of the above examples, further including a first resistor coupled between a common mode voltage source or a reference voltage source and the first input of the preamplifier.

Example 8. The peak detector of any of the above examples, further including a second resistor coupled between the common mode voltage source and the second input of the preamplifier.

Example 9. The peak detector of any of the above examples, wherein the preamplifier is configured for receiving a reference voltage or common mode voltage.

Example 10. The peak detector of any of the above examples, further including a digital-to-analog converter coupled between a reference voltage source or a common mode voltage source and the preamplifier.

Example 11. The peak detector of any of the above examples, further including a buffer amplifier interposed between the asymmetrical latch and the CMOS converter.

Example 12. According to an embodiment a method includes amplifying a differential input signal to provide an amplified differential signal; asymmetrically latching the amplified differential signal to provide a latched differential signal; and converting the latched differential signal into a CMOS-level output signal.

Example 13. The method of Example 12, wherein asymmetrically latching the amplified differential signal includes latching only in response to a rising edge of a component of the amplified differential signal crossing a latch threshold.

Example 14. The method of any of the above examples, wherein a delay between the rising edge of the component of the amplified differential signal crossing the latch threshold to providing the CMOS-level output signal is less than two nanoseconds.

Example 15. The method of any of the above examples, further removing a DC component of the differential input signal before amplifying the differential input signal.

Example 16. The method of any of the above examples, further including adjusting the latch threshold in response to a first control voltage.

Example 17. The method of any of the above examples, further including adjusting the latch threshold in response to a second control voltage different from the first control voltage.

Example 18. The method of any of the above examples, further including buffering the latched differential signal before converting the latched differential signal into the CMOS-level output signal.

Example 19. According to an embodiment, a system includes a first amplifier in communication with an attenuator; and a voltage detector coupled to an output of the first amplifier, and coupled to a control input of the attenuator, wherein the voltage detector includes a second amplifier, an asymmetrical latch, and a CMOS converter.

Example 20. The system of Example 19, further including a first resistor coupled between a common mode voltage source and a first positive input of the second amplifier, and a second resistor coupled between the common mode voltage source and a second positive input of the second amplifier.

Example 21. The system of any of the above examples, further including a digital-to-analog converter coupled between a reference voltage source and a negative input of the second amplifier.

Example 22. The system of any of the above examples, wherein the asymmetrical latch includes a rising edge detection only latch.

Example 23. The system of any of the above examples, wherein the CMOS converter includes a differential input and a single-ended output or differential output.

Example 24. The system of any of the above examples, wherein the attenuator includes a first RF input, a second RF input, a first RF output, and a second RF output; a first transistor coupled between the first RF input and the first RF output; a second transistor coupled between the second RF input and the second RF output; at least a third transistor coupled between the first RF input and the second RF input; and at least a fourth transistor coupled between the first RF output and the second RF output.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A peak detector comprising:
    an asymmetrical latch having a first input and a second input; and
    a CMOS converter having a first input coupled to a first output of the asymmetrical latch, a second input coupled to a second output of the asymmetrical latch, and an output.

2. The peak detector of claim 1, further comprising a preamplifier having a first output coupled to the first input of the asymmetrical latch and a second output coupled to the second input of the asymmetrical latch.

3. The peak detector of claim 2, further comprising a first capacitor coupled between a first RF input and a first input of the preamplifier.

4. The peak detector of claim 3, further comprising a second capacitor coupled between a second RF input and a second input of the preamplifier.

5. The peak detector of claim 3, further comprising a first resistor coupled between a common mode voltage source or a reference voltage source and the first input of the preamplifier.

6. The peak detector of claim 5, further comprising a second resistor coupled between the common mode voltage source and the second input of the preamplifier.

7. The peak detector of claim 2, wherein the preamplifier is configured for receiving a reference voltage or common mode voltage.

8. The peak detector of claim 7, further comprising a digital-to-analog converter coupled between a reference voltage source or a common mode voltage source and the preamplifier.

9. The peak detector of claim 1, wherein the asymmetrical latch is configured to latch only in response to a rising edge input signal crossing a latch threshold.

10. The peak detector of claim 1, wherein a delay of the peak detector is less than two nanoseconds.

11. The peak detector of claim 1, further comprising a buffer amplifier interposed between the asymmetrical latch and the CMOS converter.

12. A method comprising:
    amplifying a differential input signal to provide an amplified differential signal;
    asymmetrically latching the amplified differential signal to provide a latched differential signal; and
    converting the latched differential signal into a CMOS-level output signal.

13. The method of claim 12, wherein asymmetrically latching the amplified differential signal comprises latching only in response to a rising edge of a component of the amplified differential signal crossing a latch threshold.

14. The method of claim 13, wherein a delay between the rising edge of the component of the amplified differential signal crossing the latch threshold to providing the CMOS-level output signal is less than two nanoseconds.

15. The method of claim 13, further comprising adjusting the latch threshold in response to a first control voltage.

16. The method of claim 15, further comprising adjusting the latch threshold in response to a second control voltage different from the first control voltage.

17. The method of claim 12, further removing a DC component of the differential input signal before amplifying the differential input signal.

18. The method of claim 12, further comprising buffering the latched differential signal before converting the latched differential signal into the CMOS-level output signal.

19. A system comprising:
    a first amplifier in communication with an attenuator; and
    a voltage detector coupled to an output of the first amplifier, and coupled to a control input of the attenuator, wherein the voltage detector comprises a second amplifier, an asymmetrical latch, and a CMOS converter.

20. The system of claim 19, further comprising a first resistor coupled between a common mode voltage source and a first positive input of the second amplifier, and a second resistor coupled between the common mode voltage source and a second positive input of the second amplifier.

* * * * *